United States Patent [19]

Calenda et al.

[11] Patent Number: 4,758,876

[45] Date of Patent: Jul. 19, 1988

[54] THERMAL PROTECTIVE DEVICE WITH BIMETAL FOR SEMICONDUCTOR DEVICES AND THE LIKE

[75] Inventors: Ciro Calenda, Aversa; Fiorentino Imbimbo, Naples; Giuseppe Notaro, Pomigliano D'arco, all of Italy

[73] Assignee: Texas Instruments Incorporated, Dallas, Tex.

[21] Appl. No.: 919,159

[22] Filed: Oct. 15, 1986

[30] Foreign Application Priority Data

Dec. 4, 1985 [IT] Italy .............................. 48873 A/85

[51] Int. Cl.[4] .............................. H01L 23/42

[52] U.S. Cl. .............................. 357/79; 357/74; 357/81; 337/348

[58] Field of Search .............................. 357/79, 28, 72, 74, 357/81; 337/348

[56] References Cited

U.S. PATENT DOCUMENTS

| | | | |
|---|---|---|---|
| 2,714,644 | 8/1955 | Harrison | 337/348 |
| 2,795,678 | 6/1967 | Mertler | 337/348 |
| 3,575,645 | 4/1971 | Doverberger | 337/348 |
| 3,700,969 | 10/1972 | Furnival | 357/28 |
| 3,832,667 | 8/1974 | Blanton | 337/348 |
| 3,852,697 | 12/1974 | Snider | 337/348 |
| 3,861,032 | 1/1975 | Schmitt | 337/348 |
| 4,346,396 | 8/1982 | Carroll, II et al. | 357/72 |

*Primary Examiner*—Martin H. Edlow
*Assistant Examiner*—Gregory A. Key
*Attorney, Agent, or Firm*—John A. Haug; James P. McAndrews; Melvin Sharp

[57] ABSTRACT

A thermal protective device for semiconductor devices and the like comprises a housing of electrically insulative plastic material made in cup form having at the open end a seat for lodging a bimetallic disc and means for applying the cup to the semiconductor device with the bimetallic disc in direct heat exchange relation therewith. One or more electric terminals is incorporated in the housing at the time of molding and is connected in power supply circuits of the semiconductor device and/or alarm and signaling circuits. The bimetallic disc acts on said electric terminals so as to interrupt or modify the power supply to the semiconductor device or to actuate an alarm signal.

20 Claims, 3 Drawing Sheets

THERMAL PROTECTIVE DEVICE WITH BIMETAL FOR SEMICONDUCTOR DEVICES AND THE LIKE

BACKGROUND OF THE INVENTION

The present invention relates to thermal protection devices and more particularly a thermal protector suitable for guarding semiconductor devices from slow and prolonged temperature increases.

As is known, very frequently semiconductor devices are equipped with protection devices only against power supply transients characterized by strong voltage values, even if of very short duration, for the immediate purpose of preventing damage that can be caused by exposure even to very short voltages higher than those which the semiconductor devices can withstand. For this purpose one uses devices, mostly electronic, particularly adapted to attenuate these voltage peaks and characterized by extremely rapid action times, for example of the MOV (Metal Oxide Varistor) type, Zener diode and others.

In some circuit applications, however, it has been found that the semiconductor device may be subject to voltage and/or current increases of low values but of very long duration (even several minutes). This type of disturbance may cause a slow rise of the temperature of the semiconductor device above the permitted limits, causing breakage or at least malfunction due to thermal drift. It is clear, therefore that for that kind of disturbance the rapid-action electronic protective devices for voltage or current peaks do not represent an effective solution, as their intervention, if it occurs, does not occur in time to prevent the damage or malfunction.

SUMMARY OF THE INVENTION

It is, therefore, an object of the present invention to fill the gap of the electronic protection devices and to provide a protector for semiconductor devices which avoids the possiblility that an overload characterized by a low but long lasting increase of the voltage and/or current could damage or destroy the semiconductor device in question by thermal effect.

This objective is reached by means of a thermal protective device, that is, one having bimetal suitable to react to thermal effects which, in its basic form of realization, comprises a cup-shaped housing of electrically insulative plastic material closed at the top by a formed snap acting bimetallic disc and means for snapping the cup onto the semiconductor device with the bimetallic disc biased against the semidconductor device in direct heat exchange relation therewith. Electric contacts coupled to electric terminals are associated with a supply circuit of the semiconductor device and/or an alarm circuit. Energization of the circuits is controlled by the disc which moves between an unactuated configuration and an actuated configuration, i.e. between an operative position in which the supply of the semiconductor device is connected and/or the alarm is disconnected and an inoperative position in which the supply of the semiconductor device is disconnected or corrected and the alarm is connected.

Further details and advantages, as well as other structural characteristics of the present invention will become evident from the following description with reference to the attached drawings in which the preferred form of realization are represented in an illustrative but not restrictive sense.

BRIEF DESCRIPTION OF THE DRAWINS

Figure 1:
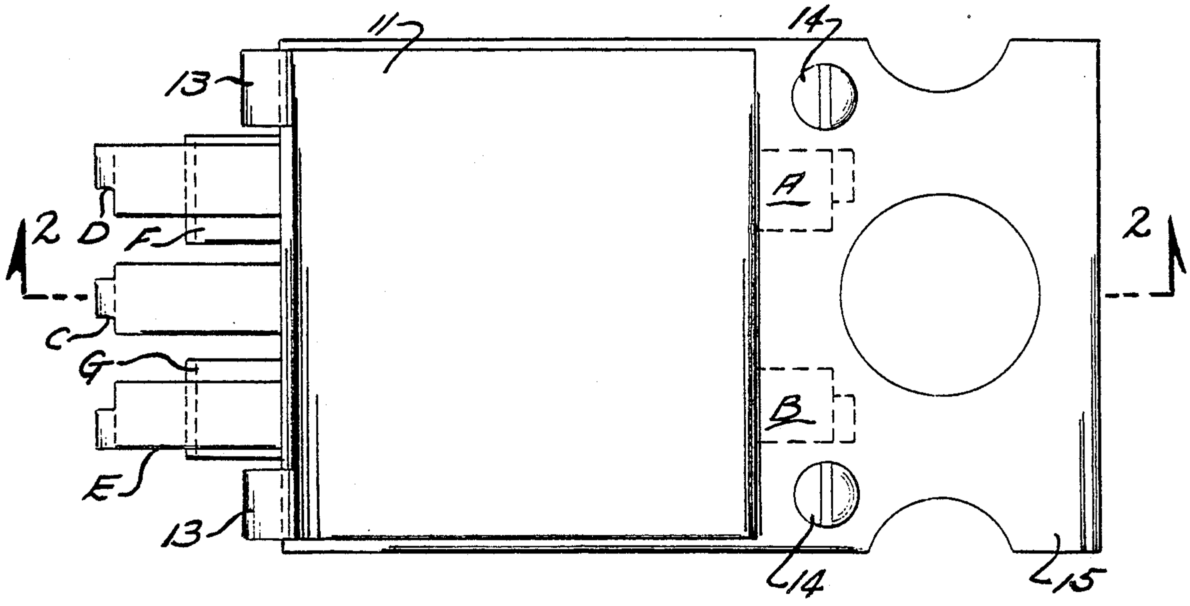
FIG. 1 is a top plan view of the protective device applied to a semiconductor device.
Figure 2:
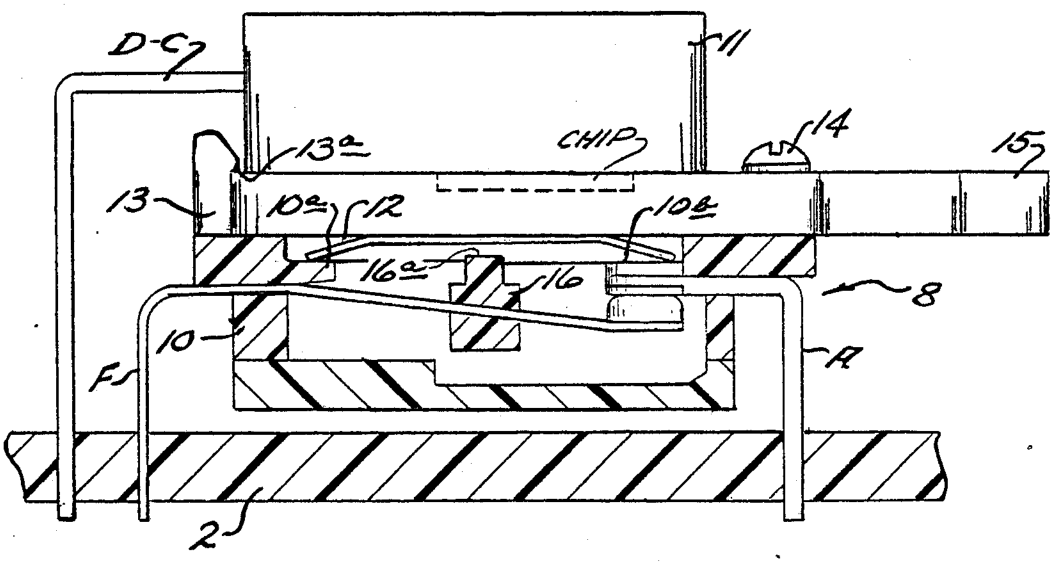
FIG. 2 is a view of the protective device shown in section along line 2—2 of FIG. 1.

With specific reference to FIGS. 1 and 2, it will be seen that the protection device 8 in question comprises a housing 10 formed so as to be applied in direct heat exchange relation with the semiconductor device 11 which must be protected and which may be a component or a chip or the like, possibly encapsulated. Semiconductor device 11 is provided with a conventional heat sink or dissipator 15.

The housing 10 is formed of electrically insulative material such as a suitable plastic and may be molded in cup form with an upper offset 10*a*, 10*b* which defines a seat for the support of the preformed bimetallic disc 12. In the form of realization shown, the housing 10 is formed with two tooth-shaped lugs 13 and two split-headed pins 14 so as to engage the edge and to fit in two holes of the heat sink 15 to firmly mount the semiconductor-heat sink assembly to the housing. Lugs 13 are provided with a lip 13*a* which is adapted to capture an edge of heat sink 15.

Although the snap-on mounting realized by means of the lugs 13 and the pins 14 is preferred, it is understood that it may be realized also in other ways, for example with screws, snapping or non-snapping hooks and the like.

Figure 3:
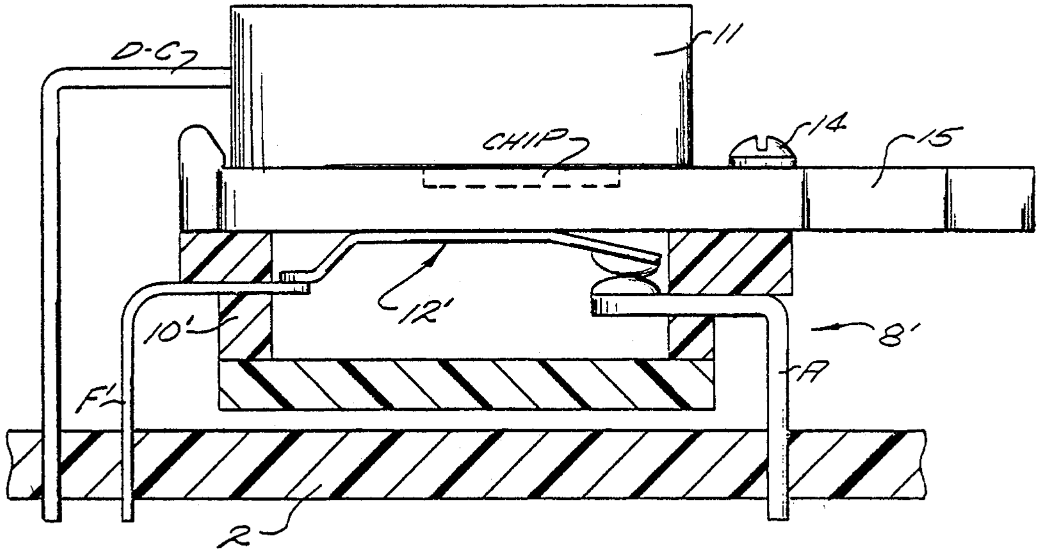
FIG. 3 is a view similar to FIG. 2 of a second embodiment of the invention.

The principle on which the present invention is based is that of utilizing the movement executed by the bimetallic disc 12 when, heated by the heat sink 15, it reaches the temperature of inversion of curvature and moves from the configuration shown to an opposite configuration, to actuate electric contacts indirectly as seen in FIG. 2 or directly as seen in FIG. 3 to be described infra. As seen in FIG. 2 disc 12 can act through a motion transfer member or pawl 16 mounted on the movable contact arms F, G to open (or close) the contacts with the terminals A, B. Pawl 16 has a portion 16a extending above the movable contact arm which is engageable with disc 12.

By way of example there has been shown in the drawings a form of realization in which, in the body of the housing 10, which may be made of one or more pieces, there are incorporated a the time of molding (overmolding technique) two electric terminals A, B and two movable contact arms F, G carrying at their ends contact elements adapted to move into and out of engagement with the terminals A and B.

The terminals A, B coupled to the movable contact arms F, G are connectable for example with the feed circuit of the semiconductor device to be protected and another circuit which may be an alarm circuit or the like.

In reference to the statement made above regarding actuating the contacts indirectly or directly, it will be understood that not only can the bimetallic disc be entirely external and independent of the circuit which is to be interrupted or of an alarm circuit which is to be energized as shown in FIG. 2 but also that the disc can be directly inserted in such circuits as shown in FIG. 3.

With reference to FIG. 3 the protective device 8', as mentioned above, employs a bimetallic disc 12' which is adapted to directly actuate electric contacts. Disc 12' is cantilever mounted as by welding, to arm F' which has been shortened so that only a short mounting portion extends into the interior of the housing. Although arm F in FIG. 2 serves as a movable contact arm the portion of arm F' extending into the interior of the housing is relatively stiff due to the shortness of the free end portion to thereby provide a suitable mounting. Housing 10' is modified to remove the disc seat 10_a_, 10_b_. The movable contact mounted on the free distal end portion of disc 12' is adapted to move between the closed contact position shown to an open contact position when the disc snaps from the nonactuated configuration to an oppositely dished shaped actuated configuration (not shown).

Those skilled in the art will be aware that besides the above described embodiment of FIG. 3 in which the disc is inserted directly in the circuit and therefore carries directly a contact element, numerous combinations of contacts and movable arms are possible, all included in the scope of the present invention.

For example, there might be provided a singel terminal A and a single movable arm F to open or close a single circuit (of power supply or alarm, respectively), or there might be provided a single movable arm not directly inserted in any circuit by carrying a bridge between the two terminals A and B for opening or closing a single circuit, as in the preceding case, and so forth.

It may therefore be said generically that, in normal operating conditions, the contacts controlled directly or indirectly by the bimetallic disc are in such a position as to allow the flow of current through the semiconductor device and hence its power supply and/or to keep an alarm or signaling device deactivated. If disturbances characterized by low and long lasting increases in voltage or current occur, the temperature of the semiconductor device and hence of the heat dissipator associated therewith and therefore also of the bimetallic disc rises until it causes said disc to snap which, transmitting the movement caused by the inversion of curvature to the contacts, directly or through appropriate mechanisms, brings them in positions such as to interrupt or correct the energization of the semiconductor device, thus avoiding its destruction or malfunction due to thermal effects, and/or to activate an alarm or a signal.

In order to achieve a satisfactory thermal coupling between the semiconductor device and disc, it is preferred to have a force of at least 20 grams between the disc in its unactuated configuration (i.e., the configuration shown in FIG. 2) and the heat sink 15. It is also preferred that the disc 12 be formed so that its central portion is relatively flat to obtain a large surface area that physically engages heat sink 15.

The bimetal protective device may be of the type as shown in FIGS. 2 and 3 with automotive resetting, that is, such that when the bimetallic disc 12 cools off, in consequence of the cooling of the heat sink 15 due to the interruption of the current in the semiconductor device, the return to the original curvature brings the contacts back to their original position, resetting the power supply to the semiconductor device, which then functions normally again provided the disturbing cause has ceased in the meantime.

Figure 4:
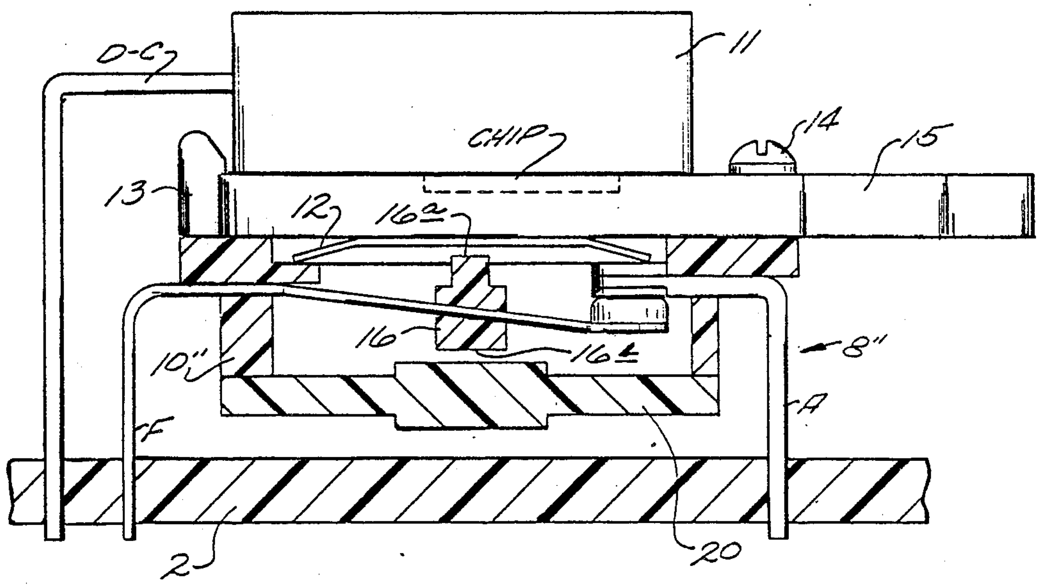
FIGS. 4 and 5 are views similar to FIG. 2 of a protective device made in accordance with the invention which includes a manual reset feature.
Figure 5:
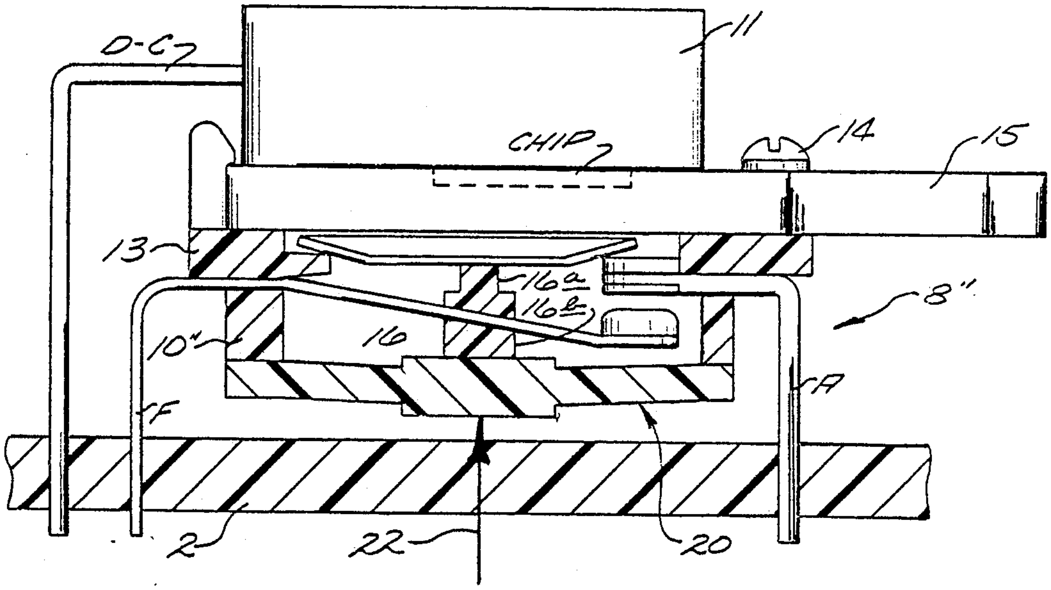

The protective device made in accordance with the invention can also be manually resettable as shown in FIGS. 4 and 5 so that the semiconductor device remains unpowered until the operator has manually and intentionally intervened to cause the disc, the movable arm F or G (or both) to snap to the original position. Protector device 8" is shown in FIG. 4 with the disc in the unactuated configuration and the contacts in engagement. Housing 10" of device 8" is provided with a bottom wall 20 which is flexible, formed of material such as an elastomer membrane. Pawl 16 not only has a portion extending above movable contact arm F as explained supra but it also has a portion 16_b_ extending below the contact arm and adapted to be engagable with bottom wall 20. In order to reset the device after the disc has snapped to an actuated configuration (FIG. 5) and after it has cooled sufficiently, a force 22 is exerted on wall 20 by a small tool insertable between device 8" and circuit board 2 (or through an aperture in circuit board 2 if perferred). Wall 20 deforms under the force causing pawl 16 to push against disc 12 to snap it back to its unactuated configuration.

Manual reactivation is required by national or international safety standards in cases where automatic reconnection of the semiconductor device may bring about hazardour situations, as in the case, for example, of electronic speed controls for tools.

In the Figures, D, C and E denote the terminals of the semiconductor device, the whole being mounted on the printed circuit board 2 (FIGS. 2-5).

In the foregoing, the preferred forms of realization have been described, but it is understood that those skilled in the art can make changes and variants without thereby going outside the scope of the following claims.

What is claimed is:

1. Thermal protective apparatus for semiconductor devices which have a plate like heat sink comprising a generally cup shaped housing formed of electrically insulative material, the housing having a bottom wall and upstanding sidewalls terminating at a free distal top end to provide an open top to the housing, a snap acting thermostatic disc mounted in the housing and being movable between a non actuated dished configuration and an opposite actuated dished configuration, a switch mechanism comprising a movable and a stationary electrical contact mounted in the housing with the movable contact adapted to move into and out of engagement with the stationary contact, first and second terminals extending into the housing and being connected respectively to the movable and stationary electrical contacts, the thermostatic disc operatively coupled to the movable contact to move the movable contact when the thermostatic disc moves from the unactuated to the actuated configurations, the thermostatic disc having two opposite end portions, one end portion of the thermostatic disc being fixed to the first terminal and the movable contact being fixed to the other opposite end of the thermostatic disc, a semiconductor device seat formed on the free distal top end of the sidewalls adapted to receive a plate like heat sink thereon, the thermostatic disc being mounted so that a central portion of the thermostatic disc projects above a plane which lies on the semiconductor device seat when the thermostatic disc is in the unactuated configuration, and means to securely lock a semiconductor device plate like heat sink on the seat whereby when a heat sink is locked on the seat the thermostatic disc is biased against the heat sink with a selected amount of force.

2. Thermal protective apparatus for semiconductor devices which have a plate like heat sink comprising a generally cup shaped housing formed of electrically insulative mateial, the housing having a bottom wall and upstanding sidewalls terminating at a free distal top end to provide an open top to the housing, a thermostatic disc seat formed in the side walls adjacent the free distal top end, a thermostatic disc disposed on the seat, the seat being completely open to the top, the thermostatic disc being movable between a non actuated dished configuration and an opposite actuated dished configuration, a switch mechanism comprising a movable and a stationary electrical contact mounted in the housing with the moveable contact adapted to move into and out of engagement with the stationary contact, first and second terminals extending into the housing and being connected respectively to the movable and stationary electrical contacts, the thermostatic disc operatively coupled to the movable contact to move the movable contact when the thermostatic disc moves from the unactuated to the actuated configurations, a semiconductor device seat formed on the free distal top end of the sidewalls adapted to receive a plate like heat sink thereon, the thermostatic disc being mounted so that a central portion of the thermostatic disc projects above a plane which lies on the semiconductor device seat when the thermostatic disc is in the unactuated configuration, and means to securely lock a semiconductor device plate like heat sink on the seat whereby when a heat sink is locked on the seat the thermostatic disc is biased against the heat sink with a selected amount of force and in the actuated configuration on the thermostatic disc the outer peripheral portion of the thermostatic disc can engage a plate like heat sink when a heat sink is locked on the seat.

3. Apparatus as defined in claim 2 in which the thermostatic disc is formed with a central flat portion to optimize heat transfer between a heat sink locked on the seat and the thermostatic disc.

4. Apparatus as defined in claim 2 in which the first terminal has an elongated portion extending into the housing culminating in a free distal end, the elongated portion serving as a movable contact arm, and the movable contact is secured to the free distal end of the elongated portion.

5. Apparatus as defined in claim 4 further including a motion transfer member attached to and extending above the elongated portion and being aligned with a central portion of the thermostatic disc to transfer motion from the thermostatic disc to the elongated portion and movable contact.

6. Apparatus according to claim 2 in which the thermostatic disc in its nonactuated configuration is biased against a semiconductor device mounted on the housing by a force of at least approximately 20 grams.

7. Thermal protective apparatus for semiconductor devices which have a plate like heat sink comprising a generally cup shaped housing formed of electrically insulative material, the housing having a bottom wall and upstanding sidewalls terminating at a free distal top end to provide an open top to the housing, a thermostatic disc seat formed in the side walls adjacent the free distal top end, a snap acting thermostatic disc movable between a non actuated dished configuration and an opposite actuated dished configuration disposed on the seat, a switch mechanism comprising a movable and a stationary electrical contact mounted in the housing with the movable contact adapted to move into and out of engagement with the stationary contact, first and second terminals extending into the housing and being connected respectively to the movable and stationary electrical contacts, the thermostatic disc operatively coupled to the movable contact to move the movable contact when the thermostatic disc moves from the unactuated to the actuated configurations, the first terminal having an elongated portion extending into the housing culminating in a free distal end, the elongated portion serving as a movable contact arm, and the movable contact secured to the free distal end of the elongated portion, a motion transfer member attached to and extending above the elongated portion and being aligned with a central portion of the thermostatic disc to transfer motion from the thermostatic disc to the elongated portion and movable contact, the motion transfer member extending below the elongated portion and the bottom wall of the housing formed of flexible material deformable toward and away from the interior of the housing whereby selected deformation of the bottom wall toward the interior of the housing will transfer a resetting force to the thermostatic disc when the thermostatic disc is in its actuated configuration, a semiconductor device seat formed on the free distal top end of the sidewalls adapted to receive a plate like heat sink thereon, the thermostatic disc seat being completely open to the top whereby in the actuated configuration of the thermostatic disc the outer peripheral portion of the thermostatic disc can engage a plate like heat sink when a heat sink is locked on the semiconductor device seat, the thermostatic disc being mounted so that a central portion of the thermostatic disc projects above a plane which lies on the semiconductor device seat when the thermostatic disc is in the unactuated configuration, and means to securely lock a semiconductor device plate like heat sink on the seat whereby when a heat sink is locked on the seat the thermostatic disc is biased against the heat sink with a selected amount of force.

8. Apparatus according to claim 2 in which at least two switch mechanisms are mounted in the housing under the control of the thermostatic disc.

9. Apparatus according to claim 2 in which the means to securely lock a semiconductor device plate like heat sink includes a portion of the side wall projecting up from the free distal top end and over at least a portion of the semiconductor device seat at a height above the free distal top end approximately equal to the thickness of a semiconductor device heat sink plate.

10. Apparatus according to claim 9 further including pin means extending upwardly from the semiconductor device seat adapted to be received in apertures provided in a semiconductor heat sink plate.

11. Apparatus as defined in claim 1 in which the thermostatic disc is formed with a central flat portion to optimize heat transfer between a heat sink locked on the seat and the thermostatic disc.

12. Apparatus according to claim 1 in which the thermostatic disc in its nonactuated configuration is biased against a semiconductor device mounted on the housing by a force of at leat approximately 20 grams.

13. Apparatus according to claim 1 in which at least two switch mechanisms are mounted in the housing under the control of the thermostatic disc.

14. Apparatus according to claim 1 in which the means to securely lock a semiconductor device plate like heat sink includes a portion of the side wall projecting up from the free distal top end and over at least a portion of the semiconductor device seat at a height above the free distal top end approximately equal to the thickness of a semiconductor device heat sink plate.

15. Apparatus according to claim 14 further including pin means extending upwardly from the semiconductor device seat adapted to be received in apertures provided in a semiconductor heat sink plate.

16. Apparatus according to claim 7 in which the thermostatic disc in its nonactuated configuration is biased against a semicondutor device mounted on the housing by a force of at least approximately 20 grams.

17. Apparatus according to claim 7 in which at least two switch mechanisms are mounted in the housing under the control of the thermostatic disc.

18. Apparatus according to claim 7 in which the means to securely lock a semiconductor device plate like heat sink includes a portion of the side wall projecting up from the free distal top end and over at least a portion of the semiconductor device seat at a height above the free distal top end approximately equal to the thickness of a semiconductor device heat sink plate.

19. Apparatus according to claim 18 further including pin means extending upwardly from the semiconductor device seat adapted to be received in apertures provided in a semiconductor heat sink plate.

20. Apparatus as defined in claim 7 in which the thermostatic disc is formed with a central flat portion to optimize heat transfer between a heat sink locked on the seat and the thermostatic disc.

* * * * *